(12) United States Patent
Taneda et al.

(10) Patent No.: US 7,544,273 B2
(45) Date of Patent: Jun. 9, 2009

(54) DEPOSITION METHODS AND STACKED FILM FORMED THEREBY

(75) Inventors: Takahiro Taneda, Osaka (JP); Koso Fujino, Osaka (JP); Kazuya Ohmatsu, Osaka (JP)

(73) Assignees: Sumitomo Electric Industries, Ltd., Osaka (JP); International Superconductivity Technology, Tokyo (JP)

(*) Notice: Subject to any disclaimer, the term of this patent is extended or adjusted under 35 U.S.C. 154(b) by 191 days.

(21) Appl. No.: 10/467,337

(22) PCT Filed: Dec. 10, 2001

(86) PCT No.: PCT/JP01/10814

§ 371 (c)(1),
(2), (4) Date: Aug. 21, 2003

(87) PCT Pub. No.: WO02/072909

PCT Pub. Date: Sep. 19, 2002

(65) Prior Publication Data

US 2004/0067386 A1 Apr. 8, 2004

(30) Foreign Application Priority Data

Mar. 9, 2001 (JP) .............................. 2001-067274

(51) Int. Cl.
*C23C 14/00* (2006.01)
(52) U.S. Cl. .............................. 204/192.1; 204/192.24; 427/62
(58) Field of Classification Search .............. 204/192.1, 204/192.24; 427/62
See application file for complete search history.

(56) References Cited

U.S. PATENT DOCUMENTS 4,111,150 A * 9/1978 Donley et al. ............... 118/704

(Continued)

FOREIGN PATENT DOCUMENTS

EP 0 669 411 A2 8/1995

(Continued)

OTHER PUBLICATIONS

Merriam-Webster's Collegiate Dictionary, 10th edition, 1997, p. 908.*

(Continued)

*Primary Examiner*—Bret Chen
(74) *Attorney, Agent, or Firm*—Foley & Lardner LLP

(57) ABSTRACT

A method of making a film having a uniform thickness and having a crystal axis parallel to a main surface of a substrate is described. In a deposition method, a film is formed by scattering a deposition material from a target (12) surface and growing the scattered deposition material on a main surface (100a) of a substrate (100). The method includes the steps of positioning the substrate (100) into a first state where the distance between one end (100f) and the target (12) is small and the distance between the other end (100e) and the target material (12) is relatively large, forming a first film (110) on the substrate (100) in the first state, positioning the substrate (100) into a second state where the distance between one end (100f) and the target (12) is large and the distance between the other end (100e) and the target (12) is small, and. forming a second film (120) on the first film (110) in the second state.

37 Claims, 7 Drawing Sheets

U.S. PATENT DOCUMENTS

| | | | |
|---|---|---|---|
| 4,244,997 A * | 1/1981 | Postupack | 428/174 |
| 4,834,856 A * | 5/1989 | Wehner | 204/192.24 |
| 4,874,664 A | 10/1989 | Hamaguchi et al. | |
| 4,923,585 A * | 5/1990 | Krauss et al. | 204/298.04 |
| 5,132,280 A * | 7/1992 | Fiory et al. | 505/413 |
| 5,145,713 A * | 9/1992 | Venkatesan et al. | 427/561 |
| 5,246,885 A * | 9/1993 | Braren et al. | 438/679 |
| 5,258,366 A * | 11/1993 | Nagaishi et al. | 505/474 |
| 5,260,251 A * | 11/1993 | Kountz et al. | 505/476 |
| 5,354,734 A * | 10/1994 | Tanaka et al. | 505/329 |
| 5,372,089 A * | 12/1994 | Yoshida et al. | 117/98 |
| 5,432,151 A * | 7/1995 | Russo et al. | 505/474 |
| 5,483,920 A * | 1/1996 | Pryor | 117/106 |
| 5,607,899 A * | 3/1997 | Yoshida et al. | 505/474 |
| 5,622,567 A * | 4/1997 | Kojima et al. | 118/726 |
| 5,624,722 A * | 4/1997 | Nagaishi et al. | 427/586 |
| 5,667,650 A * | 9/1997 | Face et al. | 204/298.07 |
| 5,747,427 A * | 5/1998 | Homma et al. | 505/476 |
| 5,810,923 A * | 9/1998 | Yano et al. | 117/84 |
| 5,854,493 A * | 12/1998 | Nakamura et al. | 257/39 |
| 6,110,336 A * | 8/2000 | Wordenweber et al. | 204/298.11 |
| 6,150,034 A | 11/2000 | Paranthaman et al. | |
| 6,187,445 B1 | 2/2001 | Ito et al. | |
| 6,214,772 B1 * | 4/2001 | Iijima et al. | 505/475 |
| 6,265,353 B1 * | 7/2001 | Kinder et al. | 505/238 |
| 6,296,701 B1 * | 10/2001 | Christen et al. | 117/94 |
| 6,361,598 B1 * | 3/2002 | Balachandran et al. | 117/86 |
| 6,485,565 B1 * | 11/2002 | Springer | 117/201 |
| 6,503,374 B1 * | 1/2003 | Tseng et al. | 204/192.15 |
| 6,596,421 B2 * | 7/2003 | Schmidt et al. | 428/701 |
| 6,632,539 B1 * | 10/2003 | Iijima et al. | 428/472 |
| 6,784,139 B1 * | 8/2004 | Sankar et al. | 505/237 |
| 6,974,501 B1 * | 12/2005 | Zhang et al. | 117/84 |
| 7,012,275 B2 * | 3/2006 | Balachandran et al. | 257/33 |
| 7,247,349 B2 * | 7/2007 | Ozin et al. | 427/283 |

FOREIGN PATENT DOCUMENTS

| | | |
|---|---|---|
| EP | 0 872 579 A2 | 10/1998 |
| JP | 6-139541 | 5/1994 |
| JP | 7-291626 A | 8/1995 |
| WO | WO 98/24944 | 6/1998 |

OTHER PUBLICATIONS

European Search Report dated Jul. 28, 2008 for counterpart application No. 01273954.6 2122.

* cited by examiner

DEPOSITION METHODS AND STACKED FILM FORMED THEREBY

TECHNICAL FIELD

The present invention relates to a stacked film and a deposition method, and more particularly to a method of depositing a stacked film as an intermediate layer where an oxide superconducting layer is formed with the intermediate layer interposed on a prescribed substrate.

BACKGROUND ART

Conventionally, for example, Japanese Patent Laying-Open No. 7-291626 describes a method of depositing an intermediate layer where an oxide superconducting layer is formed with the intermediate layer interposed on a substrate.

In the technique described in this publication, an intermediate layer is formed by a laser ablation method in which a target material is irradiated with laser light and a substance scattered from the target material is evaporated onto a substrate. A film having a particular crystal axis approximately parallel to the normal line direction to the substrate is formed by depositing the intermediate layer with the substrate inclined at a prescribed angle with respect to the target material.

Therefore, as the intermediate layer formed on the substrate is oriented in a particular direction, a superconducting layer formed thereon is also oriented, resulting in an excellent superconducting characteristic.

In the method described in the aforementioned publication, however, since the substrate is positioned inclined to the target material, the distance between one end of the substrate and the target material is relatively large while the distance between the other end of the substrate and the target material is relatively small. The film thickness of the intermediate layer is reduced on the one end side at a long distance from the target material while the film thickness of the intermediate layer is increased at the other end side at a short distance from the target material. The film thickness of the intermediate layer thus varies greatly.

Generally, the film thickness of the intermediate layer is correlated with the orientation of the intermediate layer. As the film thickness of the intermediate layer is increased, the orientation is improved. Therefore, the variations in film thickness result in variations in orientation. As a result, the superconducting layer formed on the intermediate layer varies in orientation, thereby preventing an excellent superconducting characteristic.

The film thickness of the intermediate layer also affects the surface coarseness of the intermediate layer. As the film thickness of the intermediate layer is increased, the surface coarseness is increased. Since the variations in the film thickness of the intermediate layer result in variations in surface coarseness, the superconducting layer formed thereon varies in orientation. This also prevents an excellent superconducting characteristic.

In addition, since the substrate is inclined to the target material and a source material of the intermediate layer is evaporated only from one direction, a particular crystal orientation of the intermediate layer, which should essentially be parallel to the normal line direction to the substrate, is not parallel with the normal line direction. Formation of a superconducting layer on such an intermediate layer gives an adverse effect on the orientation of the superconducting layer, resulting in a deteriorated superconducting characteristic.

DISCLOSURE OF THE INVENTION

The present invention is therefore made to solve the aforementioned problem.

An object of the present invention is to provide a stacked film with fewer variations in film thickness and a deposition method thereof.

Another object of the present invention is to provide a stacked film having a particular crystal orientation being parallel to a normal line to a substrate, and a deposition method.

In the deposition method in accordance with the present invention, a deposition material is scattered from a target material surface, and the scattered deposition material is grown on a substrate surface to form a film. The deposition method includes the following steps:

(1) positioning a substrate such that a surface of the substrate forms a prescribed angle with a surface of the target material into a first state where a distance between one end of the substrate and the target material is relatively small and a distance between the other end of the substrate and the target material is relatively large;

(2) forming a first film on the substrate in the first state;

(3) positioning the substrate such that the surface of the substrate forms a prescribed angle with the surface of the target material into a second state where the distance between the one end of the substrate and the target material is relatively large and the distance between the other end of the substrate and the target material is relatively small; and (4) forming a second film on the first film in the second state.

In the deposition method including these steps, the first film is formed in the first state where the distance between the one end of the substrate and the target material is relatively small and the distance between the other end of the substrate and the target material is relatively large, so that the first film has a thickness increased at the one end side of the substrate and a thickness reduced at the other end side of the substrate. The second film is thereafter formed on the first film in the second state where the distance between the one end of the substrate and the target material is relatively large and the distance between the other end of the substrate and the target material is relatively small, so that the second film has a thickness reduced at the one end side of the substrate and a thickness increased at the other end side of the substrate. In combination of the first film and the second film, the film thickness is approximately equal at the one end side and the other end side of the substrate. A method of depositing a film with a uniform film thickness can thus be provided.

Furthermore, in the first state, the deposition material is supplied from the one end side of the substrate as the distance between the one end side of the substrate and the target is relatively short. In the second state, the deposition material is supplied from the other end side of the substrate as the distance between the other end of the substrate and the target material is short. As a result, the deposition material is supplied from the both sides of the substrate, and a particular orientation of the film can be approximately parallel to the normal line direction to the substrate.

Preferably, the deposition method further includes a step of forming a superconducting layer on the second film.

Preferably, the deposition method further includes steps of positioning the substrate into a third state where the surface of the substrate is opposed to the surface of the target material, and forming a third film on the second film in the third state.

More preferably, the step of positioning the substrate into a third state includes a step of positioning the substrate such that the surface of the substrate is opposed approximately parallel to the surface of the target material.

Preferably, the deposition method further includes a step of forming a superconducting layer on the third film.

Preferably, the step of forming a superconducting layer includes a step of forming a superconducting layer including the following elements: at least one kind of element selected from the group consisting of yttrium (Y), holmium (Ho), samarium (Sm), lutetium (Lu), ytterbium (Yb), thulium (Tm), erbium (Er), dysprosium (Dy), gadolinium (Gd), europium (Eu), lanthanum (La) and neodymium (Nd); barium (Ba); copper (Cu); and oxygen (O), approximately at a ratio of 1:2:3:y (y is a number equal to or greater than 6).

Preferably, the step of forming a superconducting layer includes a step of forming a plurality of superconducting layers.

Preferably, the step of forming a plurality of superconducting layers includes a step of forming a plurality of superconducting layers having different compositions.

Preferably, the step of forming a superconducting layer includes forming a superconducting layer by any of ion beam sputtering (IBS), sputtering, thermal co-evaporation, MOD (Metal Organic Decomposition), MBE (Molecular Beam Epitaxy), MOCVD (Metal Organic Chemical Vapor Deposition), electron beam evaporation, and laser ablation.

Preferably, the target material is oxide.

Preferably, the target material includes at least one kind selected from the group consisting of strontium titanium oxide ($SrTiO_3$), magnesium oxide (MgO), zirconium oxide ($ZrO_2$), hafnium oxide ($HfO_2$), praseodymium oxide ($PrO_2$), zirconium gadolinium oxide ($Zr_2Gd_2O_7$), zirconium samarium oxide ($Zr_2Sm_2O_7$), zirconium lanthanum oxide ($Zr_2La_2O_7$), samarium oxide ($Sm_2O_3$), barium zirconium oxide ($BaZrO_3$), neodymium gallium oxide ($NdGaO_3$), yttria stabilized zirconia (YSZ), yttrium oxide ($Y_2O_3$), cerium oxide ($CeO_2$), ytterbium oxide ($Yb_2O_3$), and holmium oxide ($Ho_2O_3$).

Preferably, an amount of cation evaporated per unit area is approximately equal in moles in the step of forming a first film and the step of forming a second film.

Preferably, the step of forming a first film and the step of forming a second film includes forming a film by electron beam evaporation, laser ablation, sputtering, or a combination thereof.

Preferably the substrate is a metal tape having flexibility, and a direction from the one end to the other end is approximately orthogonal to a longitudinal direction of the metal tape.

Preferably, the substrate includes at least one kind selected from the group consisting of silver, silver alloy, nickel, nickel alloy and stainless steel.

Preferably, the substrate includes a plurality of layers, and each of a plurality of layers includes at least one kind selected from the group consisting of silver, silver alloy, nickel, nickel alloy, and stainless steel.

Preferably, the deposition method further includes a step of repeating the step of forming a first film and the step of forming a second film alternately multiple times.

The stacked film in accordance with the present invention is manufactured in one of the aforementioned methods. In this case, the stacked film has a multilayered structure that allows distortion to be distributed as compared with a single layer structure. Furthermore, since the interface between films is inclined to the substrate surface, it is possible to design the direction in which the distortion escapes. In designs of product applications such as superconducting cables or superconducting magnets, it is important to control the distortion exerted on a wire material. The present invention is therefore advantageous over the conventional technique in that it has a degree of freedom in its structure design where the wire material itself disperses the distortion.

Furthermore, since as compared with the single layer structure the multilayer allows the number of interfaces between films to be controlled, the heat resistance and electric resistance can be controlled. In addition, since the interface is inclined to the substrate surface, the area of the interface can be controlled and the heat resistance and electric resistance can thus be varied. This additional factor to control a physical property value as a structure increases the degree of freedom in material design. When applied to a current limiter, the present invention is advantageous over the conventional technique as the control of the heat resistance and electric resistance is important.

BEST MODES FOR CARRYING OUT THE INVENTION

FIRST EXAMPLE

Figure 1:
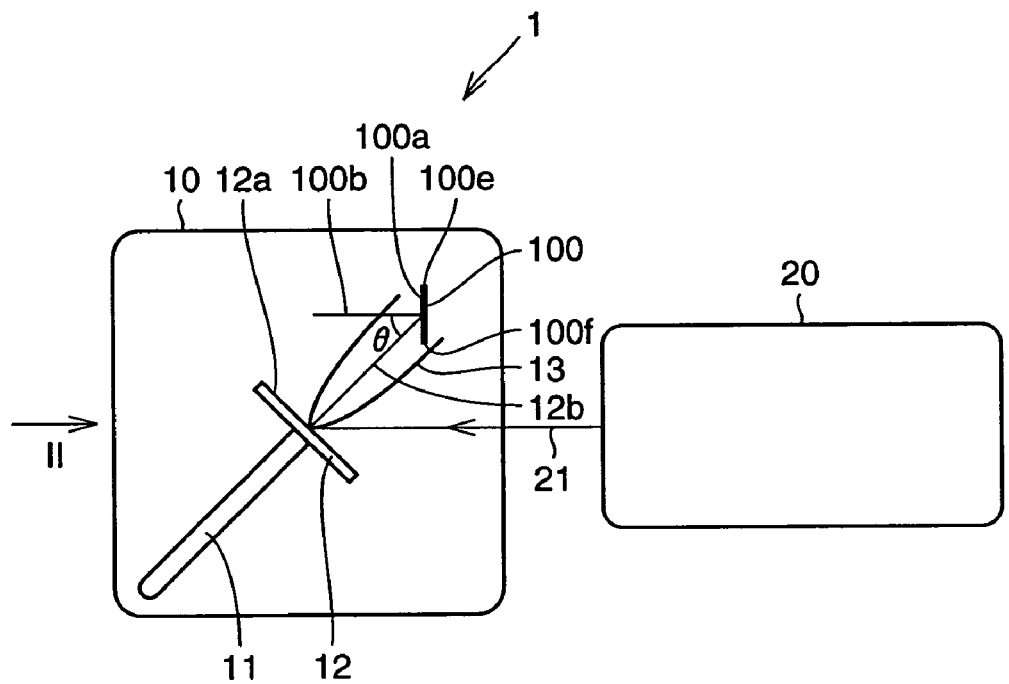
FIG. 1 is a side view of a deposition device used in a first example of the present invention.
Figure 2:
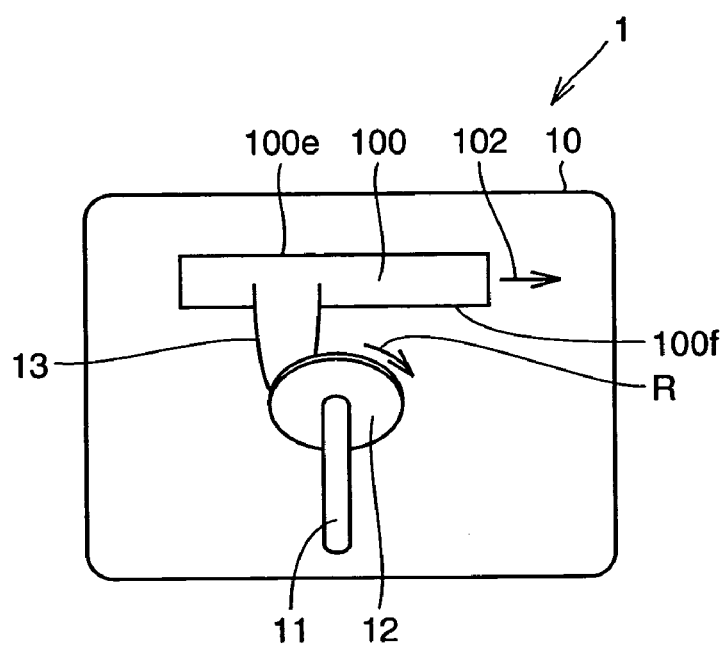
FIG. 2 is a front view of the deposition device as seen from the direction indicated by arrow II in FIG. 1.

FIG. 1 is a side view of a deposition device used in a first example of the present invention. FIG. 2 is a front view of the deposition device as seen from the direction indicated by arrow II in FIG. 1. Referring to FIGS. 1 and 2, a deposition device 1 has a vacuum chamber 10, a support rod 11 provided in vacuum chamber 10, a target 12 attached to support rod 11, and a laser oscillation device 20 externally irradiating target 12 with laser.

A substrate 100 is positioned at a position away from target 12. Substrate 100 has a main surface 100a, one end 100f, and the other end 100e. A normal line 100b to main surface 100a forms a prescribed angle θ with a normal line 12b to a main surface 12a of target 12. Support rod 11 is rotated to rotate target 12 in a direction indicated by arrow R.

Figure 3:
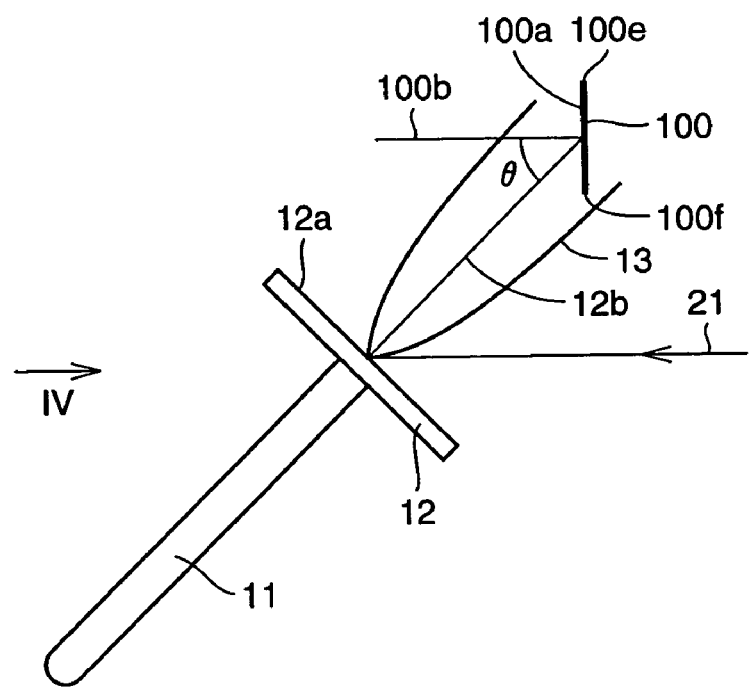
FIG. 3 is a side view of the deposition device shown to illustrate a step of depositing a first film.
Figure 4:
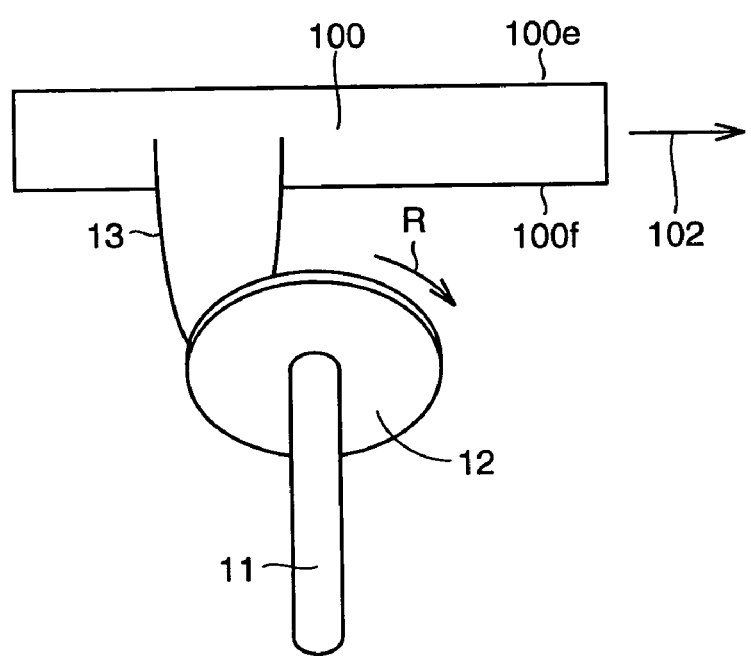
FIG. 4 is a front view of the deposition device as seen from the direction indicated by arrow IV in FIG. 3.

FIG. 3 is a side view of the deposition device shown to illustrate a step of depositing a first film. FIG. 4 is a front view of the deposition device as seen from the direction indicated by arrow IV in FIG. 3. In FIGS. 3 and 4, sintered yttria stabilized zirconia (YSZ) at a composition ratio $YO_{1.5}$: $ZrO_2$=0.16:0.84 was used as target 12. With 13 Pa (0.10 Torr) of a pressure within the vacuum chamber, the vacuum chamber was filled with argon gas. Substrate 100 was arranged such that the distance from the central portion of target 12 to the central portion of substrate 100 was 50 mm. Substrate 100 was heated to a temperature of 650° C. by a heater. Substrate 100 has a width of 10 mm, a length of 200 mm and a thickness of 0.1 mm, and is shape like a longitudinally extending tape. Substrate 100 is formed of nickel alloy.

Substrate 100 was held in a first state where the distance between one end 100f of substrate 100 and target 12 was relatively small and the distance between the other end 100e and target 12 was relatively large. At this time, normal line 100b to main surface 100a of substrate 100 formed a prescribed angle θ (=45°) with normal line 12b to main surface 12a of target 12.

Figure 5:
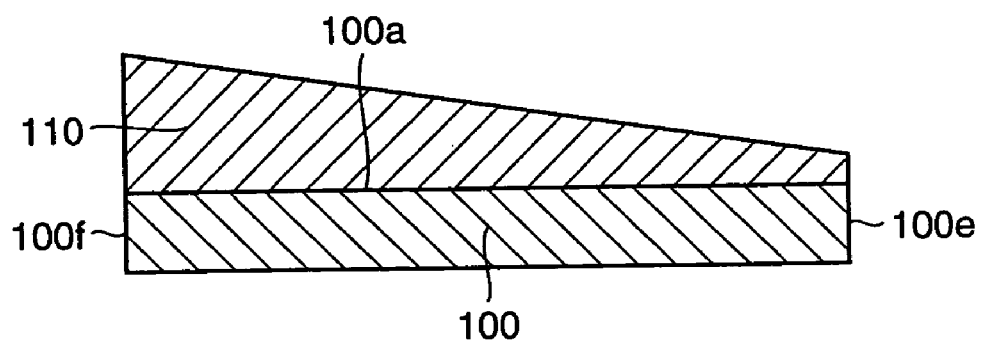
FIG. 5 is a cross sectional view of a substrate on which the first film is deposited.

Target 12 was irradiated with KrF excimer laser of a wavelength of 248 nm from the direction indicated by arrow 21. The laser energy density was 2 J/cm² and the frequency was 150 Hz. Target 12 was rotated in the direction indicated by arrow R. As a result, target 12 emitted laser plume (luminous seed) 13. Substrate 100 was longitudinally transferred in the direction indicated by arrow 102 at a speed of 7 mm/min. A first film was deposited with substrate 100 continuously passed through laser plume 13. FIG. 5 is a cross sectional view of the substrate on which the first film is deposited. Referring to FIG. 5, a first film 110 was deposited on main surface 100a of substrate 100. The thickness of first film 110 was relatively large in the vicinity of one end 100f and was relatively small in the vicinity of the other end 100e.

Figure 6:
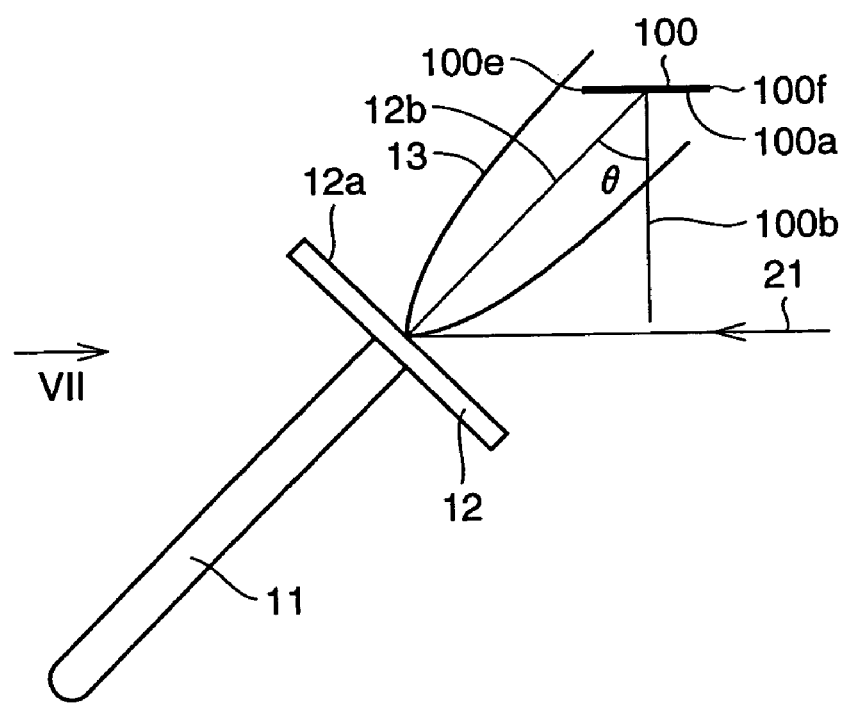
FIG. 6 is a side view of the deposition device shown to illustrate a step of depositing a second film.
Figure 7:
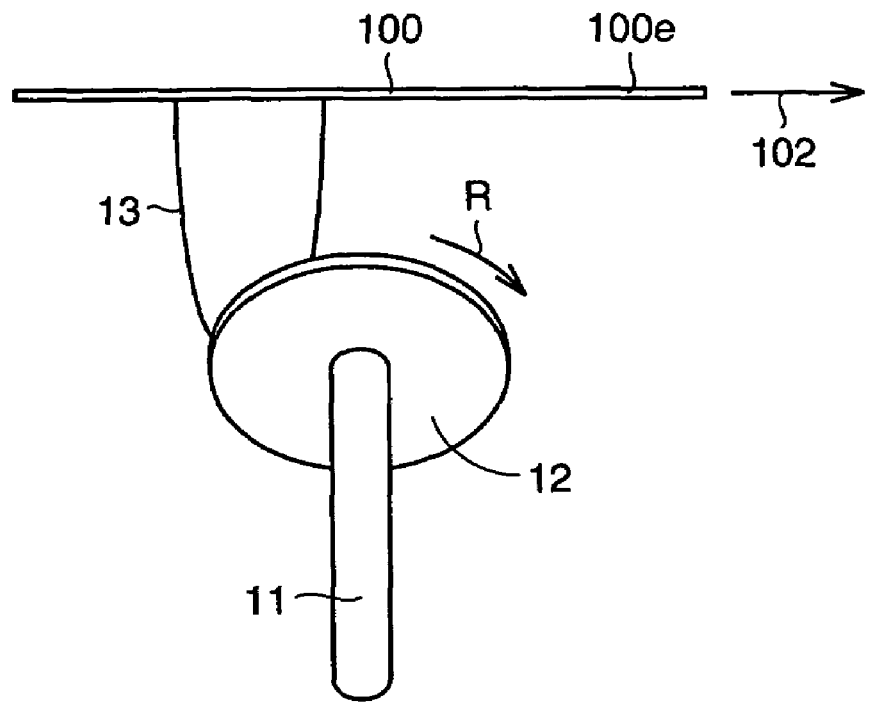
FIG. 7 is a front view of the deposition device as seen from the direction indicated by arrow VII in FIG. 6.

FIG. 6 is a side view of the deposition device shown to illustrate a step of depositing a second film. FIG. 7 is a front view of the deposition device as seen from the direction indicated by arrow VII in FIG. 6. Referring to FIGS. 6 and 7, in the deposition of the second film, substrate 100 was arranged in a second state where the distance between one end 100f of substrate 100 and target 12 was relatively large and the distance between the other end 100e of substrate 100 and target 12 was relatively small. Normal line 100b to main surface 100a of substrate 100 formed an angle of approximately 45° with normal line 12b to main surface 12a of target 12.

In this state, target 12 was irradiated with laser from the direction indicated by arrow 21 under the same conditions as the step shown in FIGS. 3 and 4. Laser plume 13 was thereby generated to deposit the second film on substrate 100.

Figure 8:
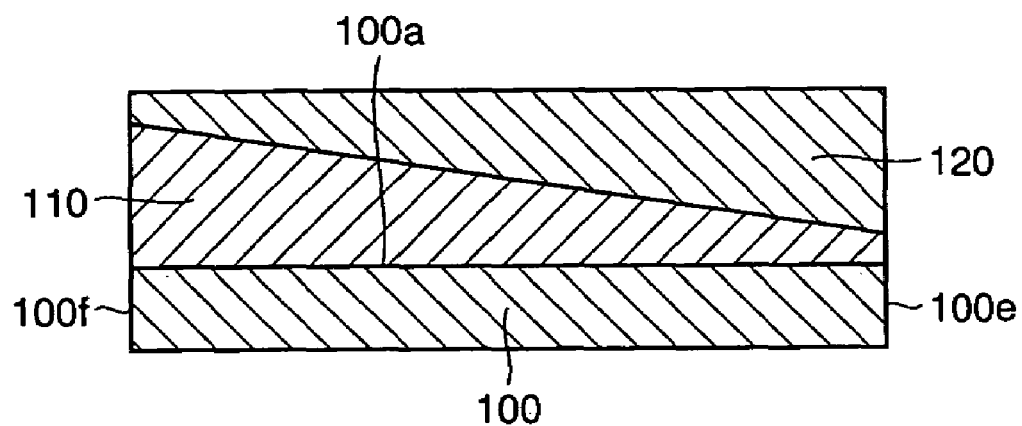
FIG. 8 is a cross sectional view of the substrate on which the second film is deposited.

FIG. 8 is a cross sectional view of the substrate on which the second film is deposited. Referring to FIG. 8, first film 110 is deposited on substrate 100, and second film 120 is deposited on first film 110. The thickness of second film 120 is smaller at the one end 100f side of substrate 100 and the thickness of second film 120 is larger at the other end 100e side. It is noted that first film 110 and second film 120 have the same composition. In combination of first film 110 and second film 120, the film thickness is approximately equal at the one end 100f side and the other end 100e side. First film 110 and second film 120 are YSZ thin film serving as an intermediate layer.

The resultant YSZ thin film was evaluated by an X-ray diffraction method, and a strong peak indicating orientation of [200] plane was observed. As a result, it was found that [200] plane was approximately parallel to main surface 100a of substrate 100 and was strongly oriented.

When the orientation of YSZ thin film was evaluated by an X-ray pole figure measurement, in-plane orientation was recognized. The half-width of φ scan of [111] plane of YSZ thin film was 22°.

Furthermore, the shift between normal line 100b to main surface 100a of substrate 100 and <200>direction of YSZ thin film (α' shift) was evaluated by the X-ray pole figure measurement. The α' shift was 32°.

The film thickness distribution of YSZ thin film was examined in the direction from one end 100f to the other end 100e of substrate 100 of YSZ thin film, to find that the film thicknesses at positions 3 mm, 5 mm and 7 mm away from one end 100f were 2.1 μm, 2.2 μm and 2.1 μm, respectively. The variation of the film thickness in this range was 0.1 μm.

SECOND EXAMPLE

Figure 9:
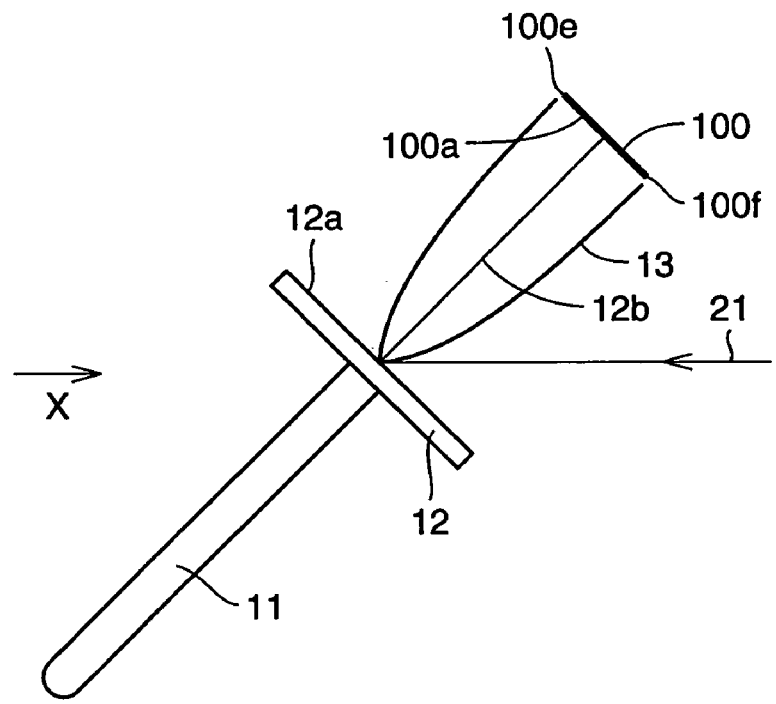
FIG. 9 is a side view of the deposition device shown to illustrate a step of depositing a third film.
Figure 10:
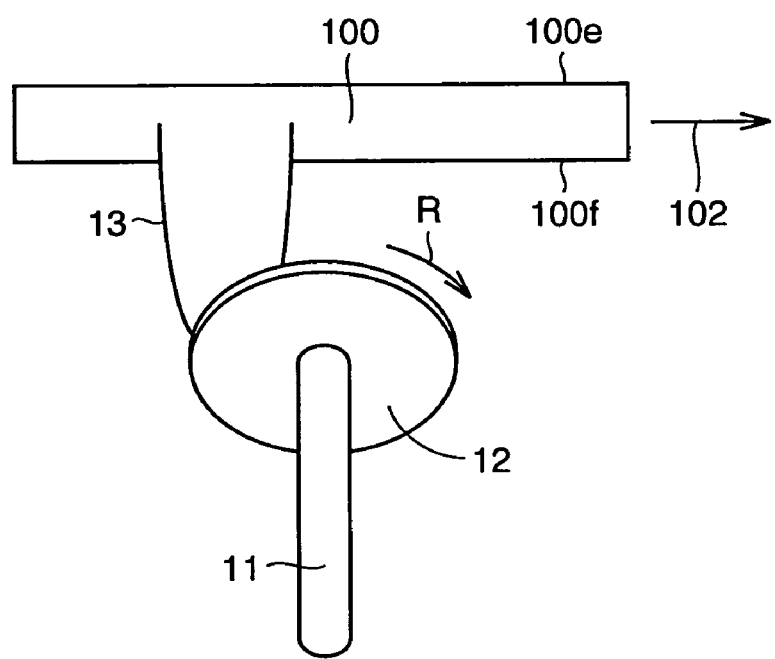
FIG. 10 is a front view of the deposition device as seen from the direction indicated by arrow X in FIG. 9.

In a second example, a thin film of yttrium oxide ($Y_2O_3$) was formed as a third film on YSZ thin film produced in the first example. FIG. 9 is a side view of the deposition device shown to illustrate a step of depositing a third film. FIG. 10 is a front view of the deposition device as seen from the direction indicated by X in FIG. 9. Referring to FIGS. 9 and 10, target 12 made of yttrium oxide was prepared, and deposition was performed using deposition device 1 while target 12 and substrate 100 were arranged parallel to each other.

Figure 11:
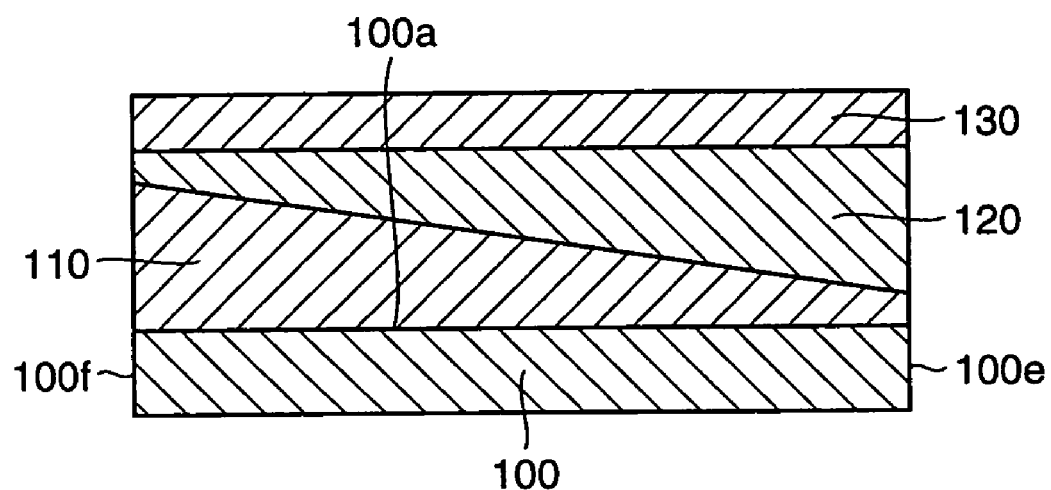
FIG. 11 is a cross sectional view of the substrate on which the third film is formed.

FIG. 11 is a cross sectional view of the substrate on which the third film is formed. Referring to FIG. 11, first film 110 is formed on main surface 100a of substrate 100, second film 120 is formed on first film 110, and a third film 130 is formed on second film 120. Third film 130 is an yttrium oxide thin film.

The resultant yttrium oxide thin film was evaluated by the X-ray diffraction method, and a strong peak indicating orientation of [400] plane was observed. As a result, it was found that [400] plane was strongly oriented approximately parallel to main surface 100a.

When the orientation of the yttrium oxide thin film was evaluated by the X-ray pole figure measurement, in-plane orientation was recognized. The half width of φ scan of [222] plane of yttrium oxide was 17°. Furthermore, the α' shift (the shift in angle between the normal line to main surface 100a and <400>direction of yttrium oxide) was 2.10°.

The film thickness distribution of the composite thin film formed of the yttria stabilized zirconia thin film and the yttrium oxide film was examined. The film thicknesses at positions 3 mm, 5 mm and 7 mm away from one end 100f of substrate 100 were 2.1 μm, 2.2 μm and 2.1 μm, respectively. The variation of the film thickness in this range was 0.1 μm.

THIRD EXAMPLE

In a third example, a cerium oxide ($CeO_2$) thin film was formed as the third film of the second example. Here, cerium oxide was used as a target. The other conditions were set as similar to the second example.

The resultant cerium oxide thin film was measured by the X-ray diffraction method, and a strong peak indicating the orientation of [200] plane was observed. As a result, it was found that [200] plane of the cerium oxide thin film was strongly oriented approximately parallel to main surface 100a of substrate 100.

When the orientation of the cerium oxide thin film was evaluated by the X-ray pole figure measurement, in-plane orientation was recognized. The half-width of φ scan of [111] plane of cerium oxide was 17°. Furthermore, the α' shift (the shift between <200>direction of cerium oxide and the normal line direction to main surface 100a) was 1.9°.

The film thickness distribution of the composite thin film made of the yttria stabilized zirconia thin film and the cerium oxide thin film was examined. The film thicknesses at positions 3 mm, 5 mm and 7 mm away from one end 100f of substrate 100 were 2.1 μm, 2.2 μm and 2.2 μm, respectively. The variation of the film thickness in this range was 0.1 μm.

FOURTH EXAMPLE

In a fourth example, an ytterbium oxide ($Yb_2O_3$) thin film was formed as the third film. Therefore, a target of ytterbium oxide was used as a target in the third deposition. The other conditions were set similar to the second example.

The resultant ytterbium oxide thin film was measured by the X-ray diffraction method, and a strong peak indicating orientation of {400} plane was observed. As a result, it was found that {400} plane was strongly oriented approximately parallel to main surface 100a of substrate 100.

When the orientation of the ytterbium oxide thin film was evaluated by the X-ray pole figure measurement, in-plane orientation was recognized. The half-width of φ scan of [222] plane of ytterbium oxide was 20°. Furthermore, the α' shift (the shift between <400>direction of ytterbium oxide and the normal line direction to main surface 100a of substrate 100) was 2.3°.

The film thickness distribution of the composite thin film formed of the yttria stabilized zirconia thin film and the ytterbium oxide thin film was examined. The film thicknesses at positions 3 mm, 5 mm and 7 mm away from one end 100f of substrate 100 were 2.1 μm, 2.2 μm and 2.1 μm, respectively. The variation of the film thickness in this range was 0.1 μm.

FIFTH EXAMPLE

In a fifth example, a holmium oxide ($Ho_2O_3$) thin film was formed as the third film in the second example. Therefore, holmium oxide was used as a target. The other conditions were set similar to the second example.

The resultant holmium oxide thin film was evaluated by the X-ray diffraction method, and a strong peak indicating orientation of {400} plane was observed. As a result, it was found that {400} plane was strongly oriented approximately parallel to main surface 100a of substrate 100.

When the orientation of the holmium oxide thin film was evaluated by the X-ray pole figure measurement, in-plane orientation was recognized. The half-width of φ scan of [222] plane of holmium oxide was 18°. Furthermore, the α' shift (the shift between <400>direction of holmium oxide and the normal line direction to main surface 100a of substrate 100) was 2.0°.

The film thickness distribution of the composite thin film formed of the yttria stabilized zirconia thin film and the holmium oxide thin film was examined. The film thicknesses at positions 3 mm, 5 mm and 7 mm away from one end 100f of substrate 100 were 2.1 μm, 2.2 μm and 2.1 μm, respectively. The variation of the film thickness in this range was 0.1 μm.

COMPARATIVE EXAMPLE

In a comparative example, an yttria stabilized zirconia thin film was formed only in the first state where the distance between one end 100f of substrate 100 and target 12 was relatively small and the distance between the other end 100e and target 12 was relatively large, as shown in FIGS. 3 and 4 in the first example.

The resultant yttria stabilized zirconia thin film was evaluated by the X-ray diffraction method, and a strong peak indicating orientation of {200} plane was observed. As a result, it was found that {200} plane was strongly oriented approximately parallel to main surface 100a of substrate 100.

When the orientation of the yttria stabilized zirconia thin film was evaluated by the X-ray pole figure measurement, in-plane orientation was recognized. The half-width of φ scan of [111] plane of yttria stabilized zirconia was 22°. Furthermore, the α' shift (the shift between <200>direction of yttria stabilized zirconia and the normal direction of main surface 100a of substrate 100) was 7.8°.

The film thickness distribution of the yttria stabilized zirconia thin film was examined. The film thicknesses at positions 3 mm, 5 mm and 7 mm away from one end 100f of substrate 100 were 1.7 μm, 2.1 μm and 2.6 μm, respectively. The variation of the film thickness in this range was 0.9 μm.

The comparative example is characterized by deposition with the substrate being inclined. This deposition method is called ISD (Inclined Substrate Deposition). The first to fifth examples are characterized by deposition by ISD followed by deposition with the substrate inclined to the opposite direction. This deposition method is called RISD (Reverse ISD). In the second to fifth examples, a third deposition is performed with the target and the substrate arranged parallel to each other after the deposition by ISD. The deposition method in this arrangement is called parallel deposition. The results obtained from the first to fifth examples and the comparative example are shown in Table 1.

TABLE 1

|  |  |  | Comparative Example | Example 1 | 2 | 3 | 4 | 5 |
|---|---|---|---|---|---|---|---|---|
| Substrate |  | Material |  | Ni alloy | | | | |
| Intermediate layer | First Layer | Material |  | YSZ | | | | |
|  |  | Process |  | ISD | | | | |
|  | Second Layer | Material |  | YSZ | | | | |
|  |  | Process | ISD | RISD | | | | |
|  | Third Layer | Material | None | | $Y_2O_3$ | $CeO_3$ | $Yb_2O_3$ | $Ho_2O_3$ |
|  |  | Process | None | | Parallel Deposition | | | |
|  |  | Film thickness distribution (μm) | 1.7, 2.1, 2.6 | | 2.1, 2.2, 2.1 | | | |
|  |  | half-width (deg) | 22 | 22 | 17 | 17 | 20 | 18 |
|  |  | α' shift (deg) | 7.8 | 3.2 | 2.1 | 1.9 | 2.3 | 2.0 |

SIXTH EXAMPLE

In a sixth example, a superconducting layer was deposited on the substrate fabricated in the comparative example and the first to fifth examples. Sintered $YBa_2Cu_3O_y$ (y is approximately 7) was used as a target of a superconducting material. In "$YBa_2Cu_3O_y$", y is roughly 6-7 and an oxygen amount varies with manufacturing conditions of the target. For use in the present invention, y is preferably as close to 7 as possible. In the following, this material will be abbreviated as YBCO for the sake of convenience.

A substrate having the thin film fabricated in the comparative example and the first to fifth examples was positioned at a distance of 50 mm away from the target. The temperature of the substrate was set at 700° C. by a heater. In a vacuum chamber, the pressure was 13 Pa (0.10 Torr) in an oxygen gas atmosphere. The target was irradiated with laser under the conditions of a laser energy density of 20 $J/cm^3$ and a frequency of 20 Hz using KrF excimer laser of a wavelength of 248 nm. The target and the substrate were arranged to be parallel to each other.

When the target was irradiated with laser light, the target emitted a luminous seed (a laser plume). The deposition was performed in such a manner that the substrate was longitudinally transferred at a speed of 3.3 mm/min and the substrate was continuously passed through the laser plume.

After the deposition was completed, the temperature of the substrate was gradually cooled from 700° C. to the room temperature while the conditions of the pressure within the chamber at 13 Pa (0.10 Torr) were maintained.

After the deposition of the superconducting layer, silver of 2 μm thick was overlaid by a general sputtering device. After the superconducting layer was introduced into a quartz tube, which was filled with oxygen gas at the room temperature with a pressure of $1.0 \times 10^5 Pa$, the temperature was increased to 700° C., and annealing was performed in this state for 10 minutes. Thereafter it was gradually cooled to the room temperature.

Figure 12:
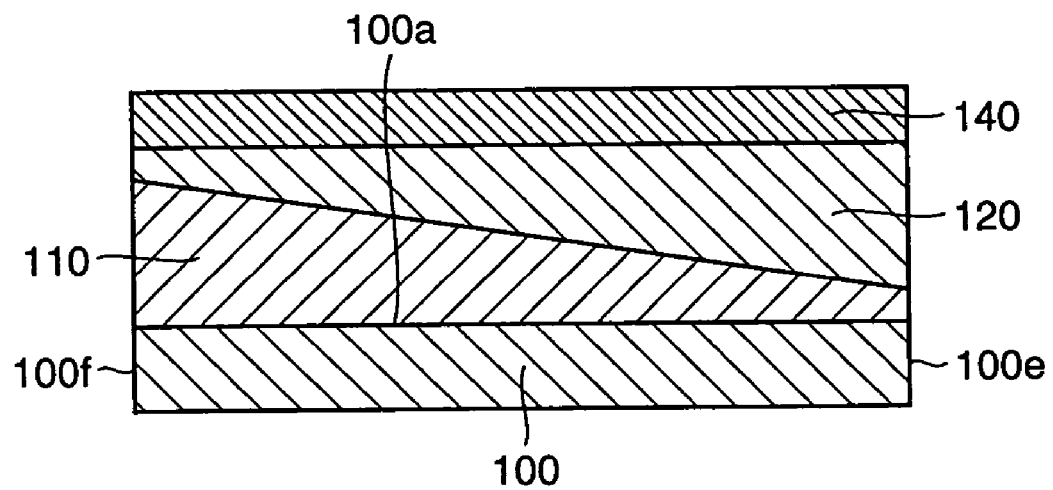
FIG. 12 is a cross sectional view of a superconducting layer formed on the second film of the first example.

FIG. 12 is a cross sectional view of the superconducting layer formed on the second film of the first example. Referring to FIG. 12, first film 110 is formed on substrate 100, second film 120 is formed on first film 110, and a superconducting layer 140 is formed on second film 120.

Figure 13:
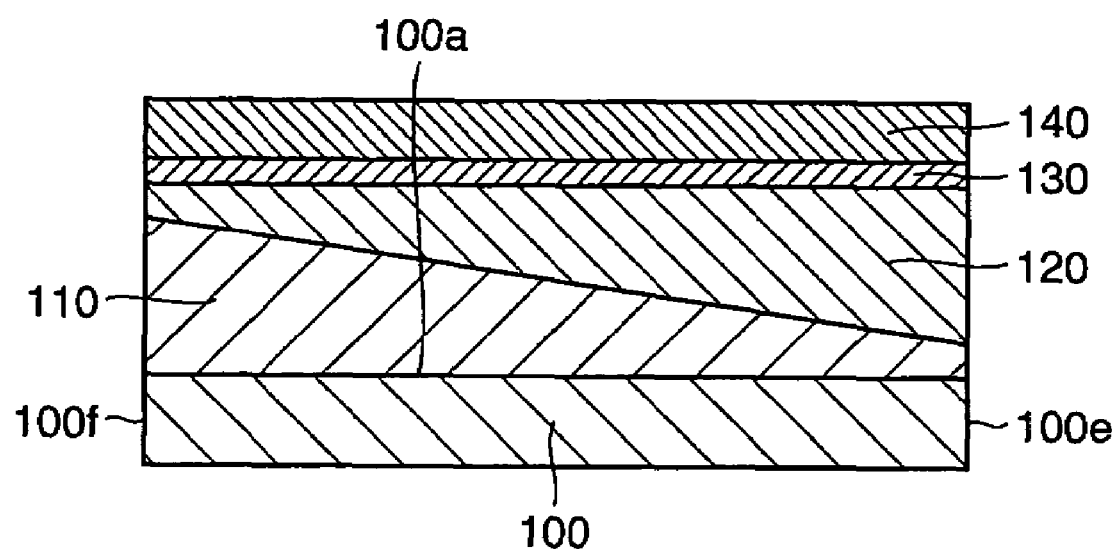
FIG. 13 is a cross sectional view of the superconducting layer formed on the third film of the second to fifth examples.

FIG. 13 is a cross sectional view of the superconducting layer formed on the third film of the second to fifth examples. Referring to FIG. 13, first film 110 is formed on substrate 100. Second film 120 is formed on first film 110. Third film 130 is formed on second film 120. Superconducting layer 140 is formed on third film 130.

The characteristics of the resultant superconducting layer are shown in Table 2.

TABLE 2

| Example No. | | | | | 6 | | | | |
|---|---|---|---|---|---|---|---|---|---|
| Substrate | Material | | | Ni Alloy | | | | | |
| Intermediate layer | First Layer | Material | | YSZ | | | | | |
| | | Process | | ISD | | | | | |
| | Second Layer | Material | | YSZ | | | | | |
| | | Process | | ISD | | RISD | | | |
| | Third Layer | Material | | None | | $Y_2O_3$ | $CeO_2$ | $Yb_2O_3$ | $Ho_2O_3$ |
| | | Process | | None | | Parallel Deposition | | | |
| | | film thickness distribution (μm) | | 1.7, 2.1, 2.6 | | 2.1, 2.2, 2.1 | | | |
| | | half-width (deg) | | 22 | 22 | 17 | 17 | 20 | 18 |
| | | α' shift (deg) | | 7.8 | 3.2 | 2.1 | 1.9 | 2.3 | 2.0 |
| Superconducting layer | Material | | | YBCO | | | | | |
| | Process | | | Parallel Deposition (Laser Ablation) | | | | | |
| | Film thickness (μm) | | | 2.1 | 1.9 | 2.2 | 1.8 | 2.0 | 2.4 |
| | half-width (deg) | | | 18 | 18 | 14 | 14 | 16 | 14 |
| | α' shift (deg) | | | 5.5 | 2.2 | 1.5 | 1.3 | 1.6 | 1.4 |
| | Jc ($A/cm^2$) | | | 1.9E+05 | 3.0E+05 | 1.2E+06 | 1.2E+06 | 9.5E+05 | 1.0E+06 |
| | Ic (A) | | | 32 | 45 | 216 | 171 | 152 | 198 |
| Process for Intermediate Layer | | | | Comparative Example | Example 1 | Example 2 | Example 3 | Example 4 | Example 5 |

Critical current Ic and critical current density Jc were measured in liquid nitrogen of a temperature 77° K. in a self-magnetic field by a dc four-terminal method. The in-plane orientation of YBCO was evaluated with the half-width of φ scan of {103} plane in the X-ray pole figure measurement.

SEVENTH EXAMPLE

In a seventh example, a superconducting layer was deposited on the substrate fabricated in the comparative example and the first to fifth examples. Sintered $HoBa_2Cu_3O_y$ (y is approximately 7) was used as a target of a superconducting material. In "$HoBa_2Cu_3O_y$", y is roughly 6-7 and an oxygen amount varies with the manufacturing conditions of the target. For use in the present invention, y is preferably as close to 7 as possible. In the following, this material will be abbreviated as HoBCO for the sake of convenience.

A superconducting layer of HoBCO thin film was formed on the substrate on which a thin film was fabricated in the comparative example and the first to fifth examples, under the similar conditions as the sixth example. A film of silver was produced on this superconducting layer under the similar conditions as the sixth example, and thereafter annealing was performed.

The characteristics of the resultant superconducting layer are shown in Table 3.

TABLE 3

| Example No. | | | | 7 | | | | |
|---|---|---|---|---|---|---|---|---|
| Substrate | Material | | | Ni Alloy | | | | |
| Intermediate layer | First layer | Material | | YSZ | | | | |
| | | Process | | ISD | | | | |
| | Second Layer | Material | | YSZ | | | | |
| | | Process | ISD | | RISD | | | |
| | Third Layer | Material | None | $Y_2O_3$ | $CeO_2$ | $Yb_2O_3$ | $Ho_2O_3$ | |
| | | Process | None | | Parallel Deposition | | | |
| | | Film thickness Distribution (μm) | 1.7, 2.1, 2.6 | | 2.1, 2.2, 2.1 | | | |
| | | Half-width (deg) | 22 | 22 | 17 | 17 | 20 | 18 |
| | | α' shift (deg) | 7.8 | 3.2 | 2.1 | 1.9 | 2.3 | 2.0 |
| Superconducting layer | Material | | | HoBCO | | | | |
| | Process | | | Parallel Deposition (Laser Ablation) | | | | |
| | Film thickness (μm) | | 1.8 | 2.1 | 2.0 | 2.4 | 1.9 | 2.0 |
| | Half-width (deg) | | 19 | 19 | 14 | 14 | 17 | 15 |
| | α' shift (deg) | | 5.1 | 2.1 | 1.4 | 1.2 | 1.5 | 1.3s |
| | Jc (A/cm$^2$) | | 2.0E+05 | 3.0E+05 | 1.0E+06 | 1.2E+06 | 9.3E+05 | 1.2E+06 |
| | Ic (A) | | 28 | 50 | 165 | 222 | 142 | 186 |
| Process for Intermediate Layer | | | Comparative Example | Example 1 | Example 2 | Example 3 | Example 4 | Example 5 |

In Table 3, critical current Ic and critical current density Jc were measured in liquid nitrogen of a temperature 77° K. in a self-magnetic field by the dc four-terminal method. The in-plane orientation of HoBCO was measured with the half-width of φ scan of {103} plane in the X-ray pole figure measurement.

While the examples of the present invention have been described above, the examples shown here may be subjected to a variety of modifications.

Firstly, in forming the third film, the target and the substrate may make an acute angle.

In the step of forming a superconducting layer, a superconducting layer may be formed including the following elements: at least one kind of element selected from the group consisting of yttrium (Y), holmium (Ho), samarium (Sm), lutetium (Lu), ytterbium (Yb), thulium (Tm), erbium (Er), dysprosium (Dy), gadolinium (Gd), europium (Eu), lanthanum (La), and neodymium (Nd); barium (Ba); copper (Cu); and oxygen (O), approximately at a ratio of 1:2:3:y (y is a number equal to or greater than 6).

A plurality of superconducting layers may be formed. For example, a stacked structure of YBCO and NdBCO may be formed. Alternatively, such a structure may be formed in that HoBCO, NdBCO, HoBCO, and NdBCO are successively stacked.

In the step of forming a superconducting layer, any of the following methods may be used: ion beam sputtering (IBS), sputtering, thermal co-evaporation, MOD (Metal Organic Decomposition), MBE (Molecular Beam Epitaxy), MOCVD (Metal Organic Chemical Vapor Deposition), electron beam evaporation, and laser ablation.

Any of the following may be used as the target: strontium titanium oxide ($SrTiO_3$), magnesium oxide (MgO), zirconium oxide ($ZrO_2$), hafnium oxide ($HfO_2$), praseodymium oxide ($PrO_2$), zirconium gadolinium oxide ($Zr_2Gd_2O_7$), zirconium samarium oxide ($Zr_2Sm_2O_7$), zirconium lanthanum oxide ($Zr_2La_2O_7$), samarium oxide ($Sm_2O_3$), barium zirconium oxide ($BaZrO_3$), neodymium gallium oxide ($NdGaO_3$), yttria stabilized zirconia (YSZ), yttrium oxide ($Y_2O_3$), cerium oxide ($CeO_3$), ytterbium oxide ($Yb_2O_3$), and holmium oxide ($Ho_2O_3$).

Although laser ablation was used as a method of manufacturing the first film and the second film, the present invention is not limited thereto, and the first and second films may be deposited by electronic beam evaporation, laser ablation, sputtering, or a combination thereof.

Furthermore, in the first and second film depositions, the amount of cation evaporated per unit area is preferably equal in moles so that the equal deposition speed is achieved.

The substrate as used here may include at least one kind selected from the group consisting of silver, silver alloy, nickel, nickel alloy, and stainless steel.

The substrate may include a plurality of layers, and each of a plurality of layers may include at least one kind selected from the group consisting of silver, silver alloy, nickel, nickel alloy, and stainless steel. For example, a substrate formed of stacked nickel and stainless or a substrate formed of stacked silver and stainless may be used.

The step of forming a first film and the step of forming a second film may be repeated alternately multiple times.

After a first film is formed with substrate 100 arranged at the position shown in FIGS. 3 and 4, a second film may be deposited with substrate 100 turned upside down, that is, with substrate 100 arranged such that one end 100f is directed upward in FIG. 1.

A first film of 0.5 μm thick, a first film of 0.5 μm thick, and a second film of 1 μm thick may successively be stacked on a metal substrate.

Alternatively, a first film, a second film, a third film, a first film, a second film, a third film, and a first film may successively be stacked on a metal substrate. The present invention can be applied to a variety of stacked layer patterns.

It should be understood that the examples disclosed herein are considered by way of illustration not by way of limitation. The scope of the present invention is shown not by the foregoing description but by the claims, and it is intended that all equivalents to the claims and all the modifications within the scope may be embraced.

In accordance with the present invention, a thin film having a thickness approximately uniform and having a prescribed orientation approximately parallel to a normal line direction to a substrate can be formed.

INDUSTRIAL APPLICABILITY

The present invention can be used in the field of a deposition method of an intermediate layer where an oxide superconducting layer is formed with the intermediate layer interposed on a substrate.

The invention claimed is:

1. A deposition method of forming a film by scattering a deposition material from a surface of a target material and growing the scattered deposition material on a surface of a substrate, comprising the steps of:
orienting said substrate in a first state in which the surface of said substrate forms a prescribed angle with respect to the surface of said target material, where a shortest distance between one end of said substrate and said target material is smaller than a shortest distance between the other end of said substrate and said target material;
forming a first film on said substrate by moving said substrate along a linear path through a region of scattered deposition material while maintaining the orientation of the substrate in said first state to produce a first film thickness that is larger at said one end than the first film thickness at the other end;
orienting said substrate in a second state in which the surface of said substrate forms said prescribed angle with respect to the surface of said target material, where a shortest distance between said one end of said substrate and said target material is larger than a shortest distance between said the other end of said substrate and said target material;
forming a second film on said first film by moving said substrate along a linear path through a region of scattered deposition material while maintaining the orientation of the substrate in said second state to produce a second film thickness that is larger at said other end than the second film thickness at the one end;
forming at least one superconducting layer on said second film; and
wherein said step of forming at least one superconducting layer includes forming at least one superconducting layer by any of ion beam sputtering, sputtering, thermal co-evaporation, metal organic decomposition, molecular beam epitaxy, metal organic chemical vapor deposition, electron beam evaporation, and laser ablation.

2. The deposition method according to claim 1, wherein said step of forming at least one superconducting layer includes a step of forming at least one superconducting layer including the following elements:
(a) at least one kind of element selected from the group consisting of yttrium, holmium, samarium, lutetium, ytterbium, thulium, erbium, dysprosium, gadolinium, europium, lanthanum, and neodymium;
(b) barium;
(c) copper; and
(d) oxygen,
wherein the elements (a), (b), (c) and (d), respectively, are provided at approximately a ratio of 1:2:3:y (y is a number equal to or greater than 6).

3. The deposition method according to claim 1, wherein said step of forming at least one superconducting layer includes a step of forming a plurality of superconducting layers.

4. The deposition method according to claim 3, wherein said step of forming a plurality of superconducting layers includes a step of forming said plurality of superconducting layers having different compositions.

5. The deposition method according to claim 1, wherein said target material is oxide.

6. The deposition method according to claim 5, wherein said target material includes at least one kind selected from the group consisting of strontium titanium oxide, magnesium oxide, zirconium oxide, hafnium oxide, praseodymium oxide, zirconium gadolinium oxide, zirconium samarium oxide, zirconium lanthanum oxide, samarium oxide, barium zirconium oxide, neodymium gallium oxide, yttria stabilized zirconia, yttrium oxide, cerium oxide, ytterbium oxide, and holmium oxide.

7. The deposition method according to claim 1, wherein an amount of cation evaporated per unit area is approximately equal in moles in said step of forming a first film and said step of forming a second film.

8. The deposition method according to claim 1, wherein said substrate is a metal tape having flexibility, and a direction from said one end to said the other end is approximately orthogonal to a longitudinal direction of said metal tape.

9. The deposition method according to claim 1, wherein said substrate includes at least one kind selected from the group consisting of silver, silver alloy, nickel, nickel alloy, and stainless steel.

10. The deposition method according to claim 9, wherein said substrate includes a plurality of layers, and each of a plurality of layers includes at least one kind selected from the group consisting of silver, silver alloy, nickel, nickel alloy, and stainless steel.

11. The deposition method according to claim 1, further comprising a step of repeating said step of forming a first film and said step of forming a second film alternately multiple times.

12. A stacked film manufactured by a method according to claim 1.

13. The deposition method according to claim 1, wherein said target material is rotated.

14. A deposition method of forming a film by scattering a deposition material from a surface of a target material and growing the scattered deposition material on a surface of a substrate, comprising the steps of:
orienting said substrate in a first state in which the surface of said substrate forms a prescribed angle with respect to the surface of said target material, where a shortest distance between one end of said substrate and said target material is smaller than a shortest distance between the other end of said substrate and said target material;
forming a first film on said substrate by moving said substrate along a linear path through a region of scattered deposition material while maintaining the orientation of the substrate in said first state to produce a first film thickness that is larger at said one end than the first film thickness at the other end;
orienting said substrate in a second state in which the surface of said substrate forms said prescribed angle with respect to the surface of said target material, where a shortest distance between said one end of said substrate and said target material is larger than a shortest distance between said the other end of said substrate and said target material;
forming a second film on said first film by moving said substrate along a linear path through a region of scattered deposition material while maintaining the orientasecond film thickness that is larger at said other end than the second film thickness at the one end;

forming at least one superconducting layer on said second film; and wherein said step of forming a first film and said step of forming a second film include forming a film by electron beam evaporation, laser ablation, sputtering, or a combination thereof.

15. The deposition method according to claim 14, wherein said target material is rotated.

16. A deposition method of forming a film by scattering a deposition material from a surface of a target material and growing the scattered deposition material on a surface of a substrate, comprising the steps of:

orienting said substrate in a first state in which the surface of said substrate forms a prescribed angle with respect to the surface of said target material, where a shortest distance between one end of said substrate and said target material is smaller than a shortest distance between the other end of said substrate and said target material;

forming a first film on said substrate by moving said substrate along a linear path through a region of scattered deposition material while maintaining the orientation of the substrate in said first state to produce a first film thickness that is larger at said one end than the first film thickness at the other end;

orienting said substrate in a second state in which the surface of said substrate forms said prescribed angle with respect to the surface of said target material, where a shortest distance between said one end said substrate and said target material is larger than a shortest distance between said the other end of said substrate and said target material;

forming a second film on said first film by moving said substrate along a linear path through a region of scattered deposition material while maintaining the orientation of the substrate in said second state to produce a second film thickness that is larger at said other end than the second film thickness at the one end;

orienting said substrate in a third state in which the surface of said substrate is opposed to the surface of said target material;

forming a third film on said second film while maintaining the orientation of the substrate in said third state;

forming at least one superconducting layer on said third film; and wherein said step of forming at least one superconducting layer includes forming at least one superconducting layer by any of ion beam sputtering, sputtering, thermal co-evaporation, metal organic decomposition, molecular beam epitaxy, metal organic chemical vapor deposition, electron beam evaporation, and laser ablation.

17. The deposition method according to claim 16, wherein said step of orienting said substrate into a third state includes a step of orienting said substrate such that the surface of said substrate is opposed approximately parallel to the surface of said target material.

18. The deposition method according to claim 16, wherein said step of forming at least one superconducting layer includes a step of forming at least one superconducting layer including the following elements:

(a) at least one kind of element selected from the group consisting of yttrium, holmium, samarium, lutetium, ytterbium, thulium, erbium, dysprosium, gadolinium, europium, lanthanum, and neodymium;

(b) barium;
(c) copper; and
(d) oxygen, wherein the elements (a), (b), (c) and (d), respectively, are provided at approximately at a ratio of 1:2:3:y (y is a number equal to or greater than 6).

19. The deposition method according to claim 16, wherein said step of forming a superconducting layer includes a step of forming a plurality of superconducting layers.

20. The deposition method according to claim 19, wherein said step of forming a plurality of superconducting layers includes a step of forming said plurality of superconducting layers having different compositions.

21. The deposition method according to claim 16, wherein said target material is oxide.

22. The deposition method according to claim 21, wherein said target material includes at lease one kind selected from a group consisting of strontium titanium oxide, magnesium oxide, zirconium oxide, hafhium oxide, praseodymium oxide, zirconium gadolinium oxide, zirconium samarium oxide, zirconium lanthanum oxide, samarium oxide, barium zirconium oxide, neodymium gallium oxide, yttria stabilized zirconia, yttrium oxide, cerium oxide, ytterbium oxide, and holmium oxide.

23. The deposition method according to claim 16, wherein an amount of cation evaporated per unit area is approximately equal in moles in said step of forming a first film and said step of forming a second film.

24. The deposition method according to claim 16, wherein said step of forming a first film and said step of forming a second film include forming a film by electron beam evaporation, laser ablation, sputtering, or a combination thereof.

25. The deposition method according to claim 16, wherein said substrate is a metal tape having flexibility, and a direction from said one end to said the other end is approximately orthogonal to a longitudinal direction of said metal tape.

26. The deposition method according to claim 16, wherein said substrate includes at least one kind selected from the group consisting of silver, silver alloy, nickel, nickel alloy, and stainless steel.

27. The deposition method according to claim 26, wherein said substrate includes a plurality of layers, and each of a plurality of layers includes at least one kind selected from the group consisting of silver, silver alloy, nickel, nickel alloy, and stainless steel.

28. The deposition method according to claim 16, further comprising a step of repeating said step of forming a first film and said step of forming a second film alternately multiple times.

29. A stacked film manufactured by a method according to claim 16.

30. The deposition method according to claim 16, wherein said target material is rotated.

31. A deposition method of forming a film by scattering a deposition material from a surface of a target material and growing the scattered deposition material on a surface of a substrate comprising the steps of:

orienting said substrate in a first state in which the surface of said substrate forms a prescribed angle with respect to the surface of said target material, where a shortest distance between one end of said substrate and said target material is smaller than a shortest distance between the other end of said substrate and said target material;

forming a first film on said substrate by moving said substrate along a linear path through a region of scattered deposition material while maintaining the orientation of the substrate in said first state to produce a first film thickness that is larger at said one end than the first film thickness at the other end;

orienting said substrate in a second state in which the surface of said substrate forms said prescribed angle with respect to the surface of said target material, where a shortest distance between said one end of said substrate and said target material is larger than a shortest distance between said the other end of said substrate and said target material;

forming a second film on said first film by moving said substrate along a linear path through a region of scattered deposition material while maintaining the orientation of the substrate in said second state, to produce a second film thickness that is larger at said other end than the second film thickness at the one end;wherein said step of forming a first film and said step of forming a second film include forming a film by electron beam evaporation, laser ablation, sputtering, or a combination thereof and wherein said substrate is a metal tape having flexibility, and a direction from said one end to said the other end is approximately orthogonal to a longitudinal direction of said metal tape.

32. The deposition method according to claim 31, wherein said target material is rotated.

33. A deposition method of forming a film by scattering a deposition material from a surface of a target material and growing the scattered deposition material on a surface of a substrate, comprising the steps of:

orienting said substrate in a first state in which the surface of said substrate forms a prescribed angle with respect to the surface of said target material, where a shortest distance between one end said substrate and said target material smaller than a shortest distance between the other end of said substrate and said target material;

forming a first film on said substrate by moving said substrate along a linear path through a region of scattered deposition material while maintaining the orientation of the substrate in said first state to produce a first film thickness that is larger at said one end than the first film thickness at the other end;

orienting said substrate in a second state in which the surface of said substrate forms said prescribed angle with respect to the surface of said target material, where a shortest distance between said one end of said substrate and said target material larger than a shortest distance between said the other end of said substrate and said target material;

forming a second film on said first film by moving said substrate along a linear path through a region of scattered deposition material while maintaining the orientation of the substrate in said second state, to produce a second film thickness that is larger at said other end than the second film thickness at the one end;

wherein said step of forming a first film and said step of forming a second film include forming a film by electron beam evaporation, laser ablation, sputtering, or a combination thereof; and wherein said substrate includes at least one kind selected from the group consisting of silver, silver alloy, nickel, nickel alloy, and stainless steel.

34. The deposition method according to claim 33, wherein said substrate includes a plurality of layers, and each of a plurality of layers includes at least one kind selected from the group consisting of silver, silver alloy, nickel, nickel alloy, and stainless steel.

35. The deposition method according to claim 33, wherein said target material is rotated.

36. A deposition method of forming a film by scattering a deposition material from a surface of a target material and growing the scattered deposition material on a surface of a substrate, comprising the steps of:

orienting said substrate in a first state in which the surface of said substrate forms a prescribed angle with respect to the surface of said target material, where a shortest distance between one end of said substrate and said target material is smaller than a shortest distance between the other end of said substrate and said target material;

forming a first film on said substrate by moving said substrate along a linear path through a region of scattered deposition material while maintaining the orientation of the substrate in said first state to produce a first film thickness that is larger at said one end than the first film thickness at the other end;

orienting said substrate in a second state in which the surface of said substrate forms said prescribed angle with respect to the surface of said target material, where a shortest distance between said one end of said substrate and said target material is larger than a shortest distance between said the other end of said substrate and said target material;

forming a second film on said first film by moving said substrate along a linear path through a region of scattered deposition material while maintaining the orientation of the substrate in said second state, to produce a second film thickness that is larger at said other end than the second film thickness at the one end;

orienting said substrate in a third state in which the surface of said substrate is opposed to the surface of said target material;

forming a third film on said second film while maintaining the orientation of the substrate in said third state;

forming at least one superconducting layer on said third film; and wherein said step of forming a first film and said step of forming a second film include forming a film by electron beam evaporation, laser ablation, sputtering, or a combination thereof.

37. The deposition method according to claim 36, wherein said target material is rotated.

* * * * *

UNITED STATES PATENT AND TRADEMARK OFFICE
CERTIFICATE OF CORRECTION

PATENT NO.         : 7,544,273 B2                                       Page 1 of 1
APPLICATION NO. : 10/467337
DATED              : June 9, 2009
INVENTOR(S)        : Takahiro Taneda et al.

It is certified that error appears in the above-identified patent and that said Letters Patent is hereby corrected as shown below:

Title Page should read:

(73) Assignees: Sumitomo Electric Industries, Ltd., Osaka (JP);
International Superconductivity Technology Center, the Juridical Foundation, Tokyo (JP)

Signed and Sealed this

Third Day of November, 2009

David J. Kappos
*Director of the United States Patent and Trademark Office*